(12) United States Patent
Hu et al.

(10) Patent No.: US 11,626,317 B2
(45) Date of Patent: Apr. 11, 2023

(54) DEEP TRENCH ISOLATION WITH SEGMENTED DEEP TRENCH

(71) Applicant: Texas Instruments Incorporated, Dallas, TX (US)

(72) Inventors: Binghua Hu, Plano, TX (US); Ye Shao, Plano, TX (US); John K Arch, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/079,451

(22) Filed: Oct. 24, 2020

(65) Prior Publication Data

US 2022/0130717 A1 Apr. 28, 2022

(51) Int. Cl.
*H01L 21/762* (2006.01)
*H01L 29/94* (2006.01)
*H01L 21/225* (2006.01)
*H01L 21/761* (2006.01)
*H01L 21/265* (2006.01)
*H01L 21/223* (2006.01)

(52) U.S. Cl.
CPC .... *H01L 21/76237* (2013.01); *H01L 21/2253* (2013.01); *H01L 21/2255* (2013.01); *H01L 21/761* (2013.01); *H01L 21/76229* (2013.01); *H01L 29/945* (2013.01); *H01L 21/2236* (2013.01); *H01L 21/26513* (2013.01)

(58) Field of Classification Search
CPC ............. H01L 29/7813; H01L 29/7812; H01L 29/7811; H01L 21/76; H01L 21/762; H01L 21/7613; H01L 21/7616; H01L 21/7618; H01L 21/76224; H01L 21/76227; H01L 21/76237; H01L 21/76264
See application file for complete search history.

(56) References Cited

U.S. PATENT DOCUMENTS

2016/0079377 A1\* 3/2016 Hutzler ............... H01L 29/7397
257/334

\* cited by examiner

*Primary Examiner* — Julio J Maldonado
*Assistant Examiner* — Stanetta D Isaac
(74) *Attorney, Agent, or Firm* — Andrew R. Ralston; Frank D. Cimino

(57) ABSTRACT

A semiconductor device has a first trench and a second trench of a trench structure located in a substrate. The second trench is separated from the first trench by a trench space that is less than a first trench width of the first trench and less than a second trench width of the second trench. The trench structure includes a doped sheath having a first conductivity type, contacting and laterally surrounding the first trench and the second trench. The doped sheath extends from the top surface to an isolation layer and from the first trench to the second trench across the trench space. The semiconductor device includes a first region and a second region, both located in the semiconductor layer, having a second, opposite, conductivity type. The first region and the second region are separated by the first trench, the second trench, and the doped sheath.

18 Claims, 12 Drawing Sheets

DEEP TRENCH ISOLATION WITH SEGMENTED DEEP TRENCH

FIELD

This disclosure relates to the field of semiconductor devices. More particularly, but not exclusively, this disclosure relates to trench isolation in semiconductor devices.

BACKGROUND

Dielectric or conductive deep trenches are deployed in semiconductor devices and have multiple applications. In a semiconductor device, dielectric trenches may serve as isolation barriers between semiconductor devices. Conductive deep trenches segregate high voltage components from low voltage components.

SUMMARY

The present disclosure introduces a semiconductor device having a first trench and a second trench of a trench structure located in a substrate of the semiconductor device. The substrate includes a semiconductor layer over an isolation layer. The trenches extend from a top surface of a semiconductor layer to the isolation layer. The first trench has a first trench width, and the second trench has a second trench width. The second trench is separated from the first trench by a trench space that may be less than a first trench width and less than the second trench width. The trench structure includes a doped sheath contacting and laterally surrounding the first trench and the second trench. The doped sheath has a first conductivity type and extends from the top surface to the isolation layer and from the first trench to the second trench across the trench space. The semiconductor device includes a first region and a second region, both located in the semiconductor layer, and having a second conductivity type opposite from the first conductivity type. The first region and the second region are separated by the first trench, the second trench, and the doped sheath.

DETAILED DESCRIPTION

Figure 1:
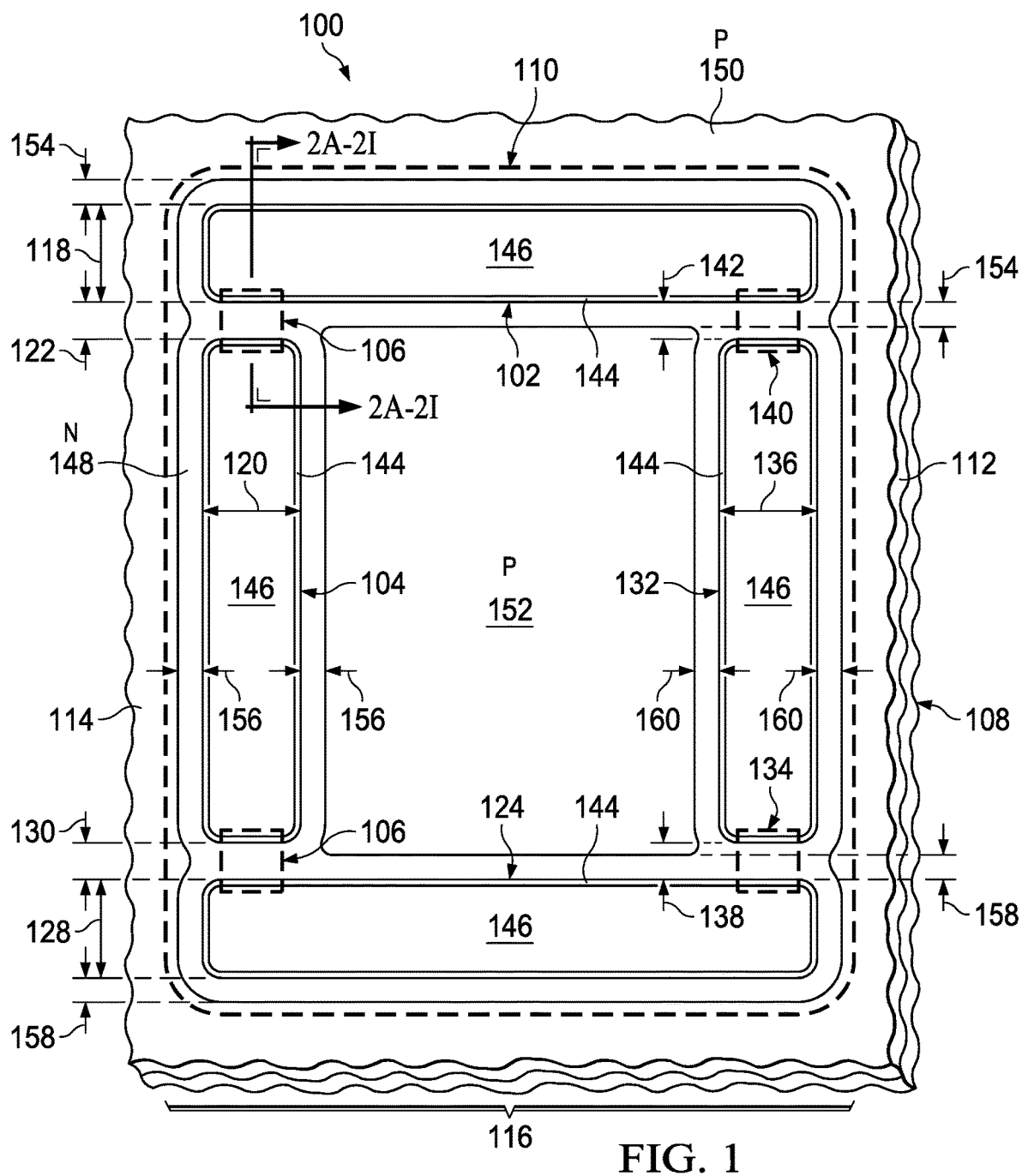
FIG. 1 is a top view of an example semiconductor device having a first trench and a second trench separated by a first trench space.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

A semiconductor device has a substrate with an isolation layer and a semiconductor layer on the isolation layer. The isolation layer may include a buried layer of semiconductor material having a first conductivity type, or may include a dielectric material. The semiconductor layer has a top surface, located opposite from the isolation layer. The semiconductor device includes a trench structure in the substrate. The trench structure includes at least a first trench and a second trench in the substrate, extending from the top surface to the isolation layer. The first trench has a first trench width, and the second trench has a second trench width. The second trench is separated from the first trench by a trench space that is less than a first trench width and less than the second trench width. The trench structure includes a doped sheath having the first conductivity type contacting and laterally surrounding the first trench and the second trench. The doped sheath extends from the top surface to the isolation layer and from the first trench to the second trench across the trench space. The semiconductor device includes a first region and a second region, located in the semiconductor layer, on opposite sides of the doped sheath. The first region and the second region have a second conductivity type, opposite from the first conductivity type. The first region and the second region are electrically isolated from each other through the trench space by the doped sheath, which may advantageously provide a desired level of electrical isolation at a lower level of stress in the first region and the second region, compared to a similar semiconductor device in which the first trench and the second trench meet at a trench intersection.

In this disclosure and the claims that follow, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques or deposition techniques such as chemical vapor deposition (CVD), physical vapor deposition (PVD), plasma enhanced chemical vapor deposition (PECVD), or atomic layer deposition (ALD), for example. As another example, silicon nitride may be a silicon-rich silicon nitride or an oxygen-rich silicon nitride.

It is noted that terms such as top, bottom, over, under, and side may be used in this disclosure. These terms should not be construed as limiting the position or orientation of a structure or element, but should be used to provide spatial relationship between structures or elements. Similarly, the term "outward" refers to directions away from the device or area or designated parts thereof.

FIG. 1 is a top view of an example semiconductor device 100 having a first trench 102 and a second trench 104 separated by a first trench space 106. The semiconductor device 100 may be manifested as an integrated circuit, a discrete semiconductor component, or a microelectrical mechanical system (MEMS) device, by way of example. The semiconductor device 100 is formed in and on a substrate 108. The substrate 108 includes an isolation layer 110 and a semiconductor layer 112 on the isolation layer 110. The semiconductor layer 112 has a top surface 114 located opposite from the isolation layer 110. In one version of this example, the substrate 108 may be manifested as a semiconductor wafer or a portion of a semiconductor wafer after device singulation, the isolation layer 110 may be manifested as a buried layer that includes a semiconductor material having a first conductivity type, and the semiconductor layer 112 may be manifested as an epitaxial layer of semiconductor material having a second conductivity type, opposite from the first conductivity type. In another version of this example, the substrate 108 may be manifested as a silicon-on-insulator (SOI) wafer, the isolation layer 110 may be manifested as a buried oxide layer or a sapphire handle wafer, and the semiconductor layer 112 may be manifested as a layer of semiconductor material. Other manifestations of the substrate 108, the isolation layer 110, and the semiconductor layer 112 are within the scope of this example. The isolation layer 110 may have a limited extent in the substrate 108, as depicted in FIG. 1, or may extend across the semiconductor device 100.

The semiconductor device 100 includes a trench structure 116 which includes the first trench 102 and the second trench 104. Both the first trench 102 and the second trench 104 extend from the top surface 114 of the semiconductor layer 112 to the isolation layer 110. The second trench 104 is separated from the first trench 102 by the first trench space 106. The first trench 102 has a first trench width 118 which is a minimum lateral dimension of the first trench 102 measured at the top surface 114. Similarly, the second trench 104 has a second trench width 120 which is a minimum lateral dimension of the second trench 104 measured at the top surface 114. The terms "laterally" and "lateral" refer to directions parallel to the top surface 114, and similarly for other examples disclosed herein. The first trench space 106 has a first space width 122 which is a minimum lateral distance between the first trench 102 and the second trench 104, measured at the top surface 114.

In this example, the trench structure 116 includes a third trench 124 which extends from the top surface 114 of the semiconductor layer 112 to the isolation layer 110. The third trench 124 is separated from the second trench 104 by a second trench space 126. The third trench 124 has a third trench width 128 which is a minimum lateral dimension of the third trench 124 measured at the top surface 114. The second trench space 126 has a second space width 130 which is a minimum lateral distance between the second trench 104 and the third trench 124, measured at the top surface 114.

In this example, the trench structure 116 includes a fourth trench 132 which extends from the top surface 114 of the semiconductor layer 112 to the isolation layer 110. The fourth trench 132 is separated from the third trench 124 by a third trench space 134. The fourth trench 132 has a fourth trench width 136 which is a minimum lateral dimension of the fourth trench 132 measured at the top surface 114. The third trench space 134 has a third space width 138 which is a minimum lateral distance between the third trench 124 and the fourth trench 132, measured at the top surface 114.

The fourth trench 132 is separated from the first trench 102 by a fourth trench space 140. The fourth trench space 140 has a fourth space width 142 which is a minimum lateral distance between the fourth trench 132 and the first trench 102, measured at the top surface 114.

Preferably, without implied limitation, the first space width 122 is less than the first trench width 118 and is less than the second trench width 120; the second space width 130 is less than the second trench width 120 and is less than the third trench width 128, the third space width 138 is less than the third trench width 128 and is less than the fourth trench width 136, and the fourth space width 142 is less than the fourth trench width 136 and is less than the first trench width 118.

The trenches 102, 104, 124, and 132 may include a trench liner 144 and a trench filler material 146 on the trench liner 144. The trench liner 144 may include a dielectric material, such as silicon dioxide. The trench filler material 146 may include a dielectric material such as silicon dioxide, or may include an electrically conductive material such as polycrystalline silicon, commonly referred to as polysilicon. Other materials for the trench liner 144 and the trench filler material 146 are within the scope of this example.

The trench structure 116 includes a doped sheath 148 which contacts and laterally surrounds the first trench 102, the second trench 104, the third trench 124, and the fourth trench 132. In the first trench space 106, the doped sheath 148 extends from the top surface 114 of the semiconductor layer 112 to the isolation layer 110 and from the first trench 102 to the second trench 104. In the second trench space 126, the doped sheath 148 extends from the top surface 114 of the semiconductor layer 112 to the isolation layer 110 and from the second trench 104 to the third trench 124. In the third trench space 134, the doped sheath 148 extends from the top surface 114 of the semiconductor layer 112 to the isolation layer 110 and from the third trench 124 to the fourth trench 132. In the fourth trench space 140, the doped sheath 148 extends from the top surface 114 of the semiconductor layer 112 to the isolation layer 110 and from the fourth trench 132 to the first trench 102.

The doped sheath 148 has a first conductivity type, which may be manifested as n-type in this example, as indicated in FIG. 1. In other versions of this example in which the isolation layer 110 includes a buried layer of semiconductor material, the semiconductor material has the first conductivity type, and the doped sheath 148 makes an electrical connection to the isolation layer 110.

An external region 150 of the semiconductor layer 112 located outside of the trench structure 116 and abutting the doped sheath 148 has a second conductivity type, opposite from the first conductivity type. The second conductivity type may be manifested as p-type. In this example, the first trench 102, the second trench 104, the third trench 124, the fourth trench 132, and the doped sheath 148 completely laterally surround an isolated region 152 of the semiconductor layer 112. The isolation layer 110 extends completely below the isolated region 152. The isolated region 152 has the second conductivity type.

The doped sheath 148 extends outward from the first trench 102 to the external region 150 and to the isolated region 152 by a first outward distance 154. The first outward distance 154 is 0.1 microns to 6 microns. Similarly, the doped sheath 148 extends outward from the second trench 104 to the external region 150 and to the isolated region 152 by a second outward distance 156 of 0.1 microns to 6 microns, extends outward from the third trench 124 to the external region 150 and to the isolated region 152 by a third outward distance 158 of 0.1 microns to 6 microns, and extends outward from the fourth trench 132 to the external region 150 and to the isolated region 152 by a fourth outward distance 160 of 0.1 microns to 6 microns. The first outward distance 154, the second outward distance 156, the third outward distance 158, and the fourth outward distance 160 are measured outside of the first trench space 106, the second trench space 126, the third trench space 134, and the fourth trench space 140.

The isolated region 152 is electrically isolated from the external region 150 of the semiconductor layer 112 by a combination of the trench structure 116 and the isolation layer 110. Having the first trench 102 separated from the second trench 104 by the first trench space 106, the second trench 104 separated from the third trench 124 by the second trench space 126, the third trench 124 separated from the fourth trench 132 by the third trench space 134, and fourth trench 132 separated from the first trench 102 by the fourth trench space 140 may advantageously provide a desired level of electrical isolation between the isolated region 152 and the external region 150 at a lower level of stress in the isolated region 152 and the external region 150, compared to a similar semiconductor device in which the trenches 102, 104, 124, and 132 meet at trench intersections.

Figure 2A:
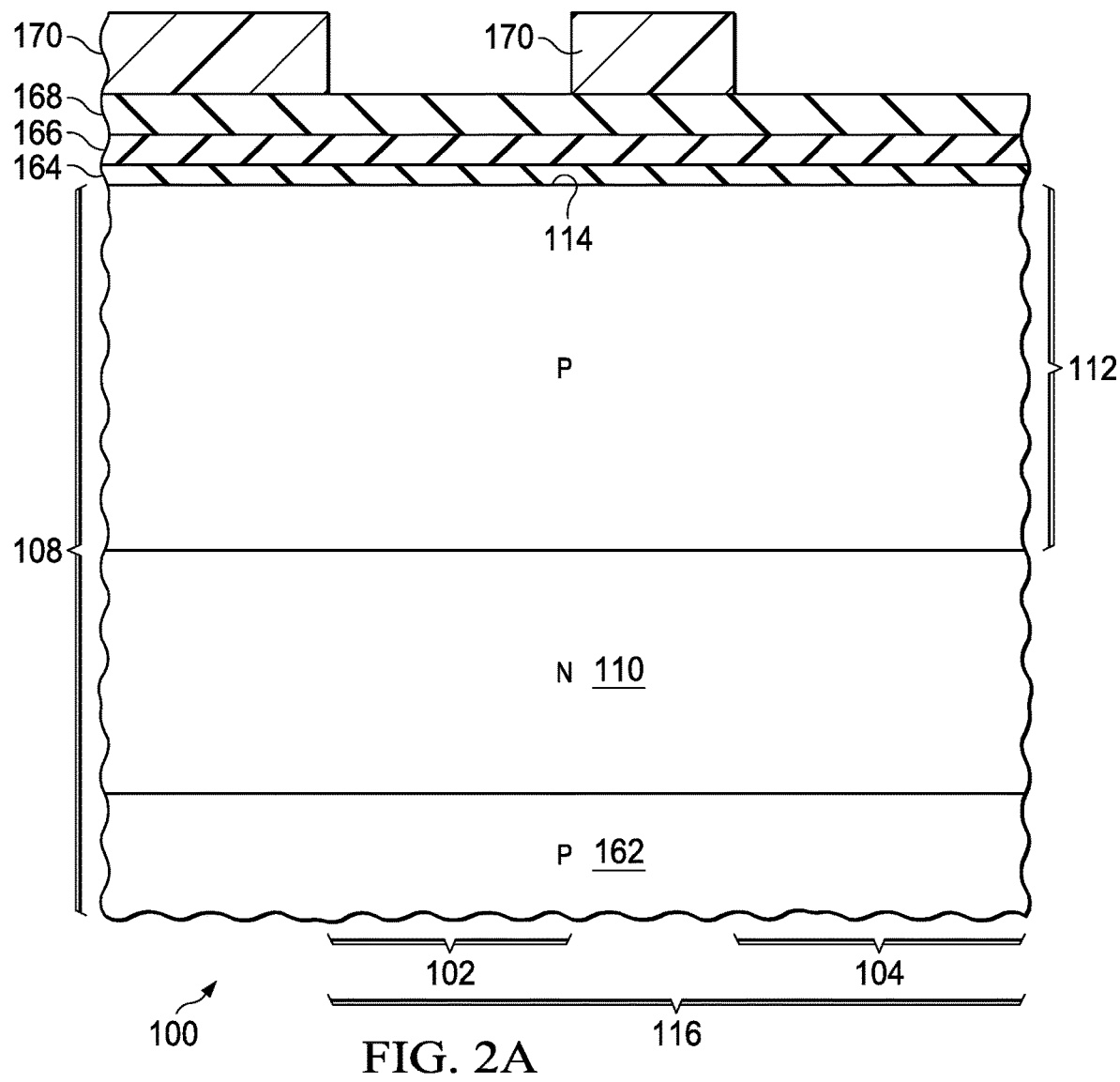
FIG. 2A through FIG. 2I are cross sections of the semiconductor device of FIG. 1, depicted in stages of an example method of formation.

FIG. 2A through FIG. 2I are cross sections of the semiconductor device 100 of FIG. 1, depicted in stages of an example method of formation. FIG. 2A through FIG. 2I depict the first trench 102 and the second trench 104. At each, processes that relate to the first trench 102 and the second trench 104 also relate to the third trench 124 and the fourth trench 132 of FIG. 1, in similar manners. Referring to FIG. 2A, the semiconductor device 100 is formed in and on the substrate 108, which includes the isolation layer 110 and the semiconductor layer 112 on the isolation layer 110. The top surface 114 of the semiconductor layer 112 is located opposite from the isolation layer 110. The substrate 108 may include a handle wafer 162 under the isolation layer 110, opposite from the semiconductor layer 112. The semiconductor layer 112 may include primarily silicon, with p-type dopants such as boron. The isolation layer 110 may include primarily silicon, with n-type dopants such as arsenic and antimony, phosphorus, or a combination thereof. The handle wafer 162 may include primarily silicon, with p-type dopants. The isolation layer 110 may be formed by implanting the n-type dopants into the handle wafer 162 and diffusing the n-type dopants by a thermal drive process. The semiconductor layer 112 may be formed by an epitaxial process on the isolation layer 110.

A pad oxide layer 164 may be formed on the top surface 114 of the semiconductor layer 112. The pad oxide layer 164 may include silicon dioxide that is formed by a thermal oxidation process or a CVD process. The pad oxide layer 164 provides stress relief between the semiconductor layer 112 and subsequent layers. The pad oxide layer 164 may be 5 nanometers to 50 nanometers thick, by way of example.

A silicon nitride cap layer 166 may be formed on the pad oxide layer 164. The silicon nitride cap layer 166 serves the function of exclusionary film allowing selective oxidation, and it may include silicon nitride that is deposited by a low-pressure chemical vapor deposition (LPCVD) furnace process. The silicon nitride cap layer 166 may be 100 nanometers to 500 nanometers thick, by way of example.

A hard mask layer 168 may be formed on the silicon nitride cap layer 166. The hard mask layer 168 serves the function of a hard mask to prevent removal of the silicon nitride cap layer 166 during a subsequent deep trench etch process. The hard mask layer 168 may include a silicon dioxide that is deposited by a PECVD process. The hard mask layer 168 has a thickness that depends on depths of subsequently-formed deep trenches by the deep trench etch process.

A trench mask 170 is formed on the hard mask layer 168. The trench mask 170 exposes the hard mask layer 168 in an area for the first trench 102 and in an area for the second trench 104. The trench mask 170 may include photoresist, and may be formed by a photolithographic process including coating the hard mask layer 168 with a light sensitive organic material, exposing the light sensitive organic material to patterned ultraviolet (UV) light, and developing the light sensitive organic material.

Figure 2B:
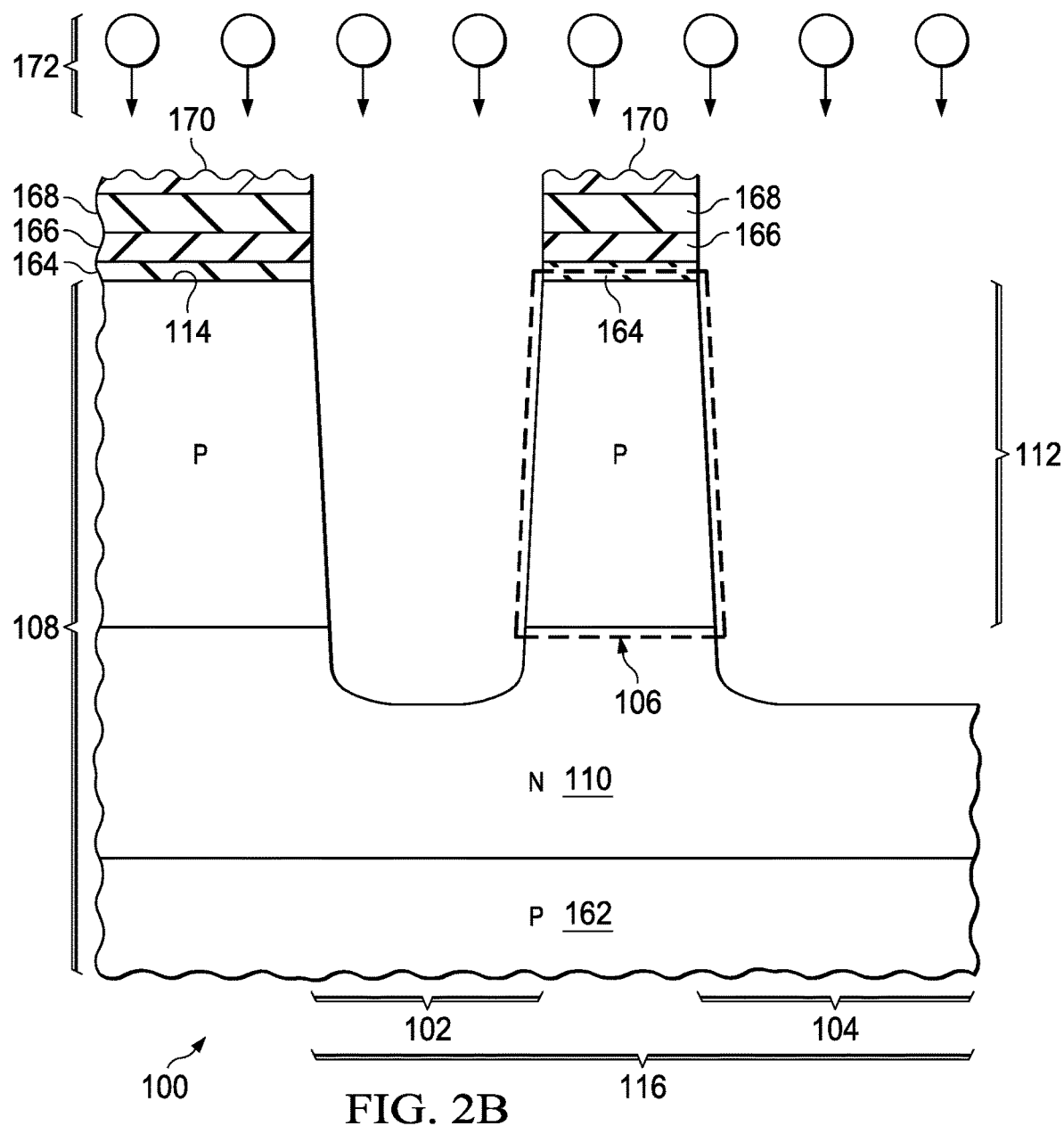

Referring to FIG. 2B, a deep trench etch process 172 is performed to form the first trench 102 and the second trench 104. The deep trench etch process 172 may include multiple sequences. In one implementation, for example, a hard mask etch may be first performed to remove the hard mask layer 168 where exposed by the trench mask 170, and a silicon etch process may then be performed to remove the silicon nitride cap layer 166, the pad oxide layer 164, and the semiconductor layer 112, where exposed by the remaining hard mask layer 168. The deep trench etch process 172 may remove a portion of the underlying isolation layer 110. During the silicon etch, the trench mask 170 is also removed, leaving the etched hard mask layer 168 to prevent the area outside of the first trench 102 and the second trench 104 from being etched. FIG. 2B depicts removal of the trench mask 170 partially removed. The deep trench etch process 172 may be implemented as a two-step etch process, in which a first step passivates sidewalls of the first trench 102 and the second trench 104, and the second step etches semiconductor material from bottoms of the first trench 102 and the second trench 104. Alternatively, the deep trench etch process 172 may be implemented as a continuous etch process, which concurrently passivates sidewalls and etches semiconductor material from bottoms of the first trench 102 and the second trench 104. The first trench space 106 extends from the first trench 102 to the second trench 104 and extends from the isolation layer 110 to the top surface 114 of the semiconductor layer 112.

Figure 2C:
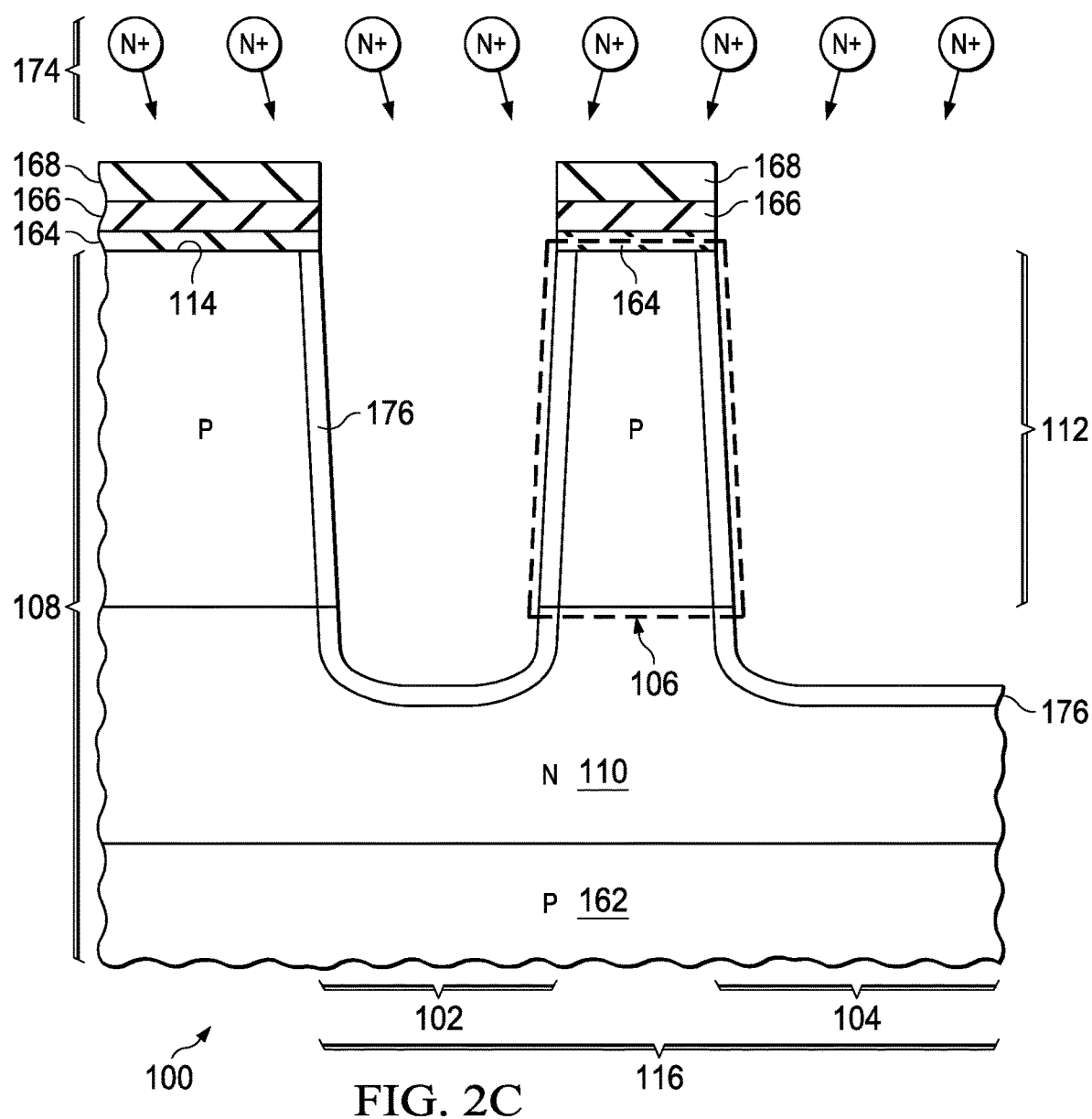
Figure 2D:
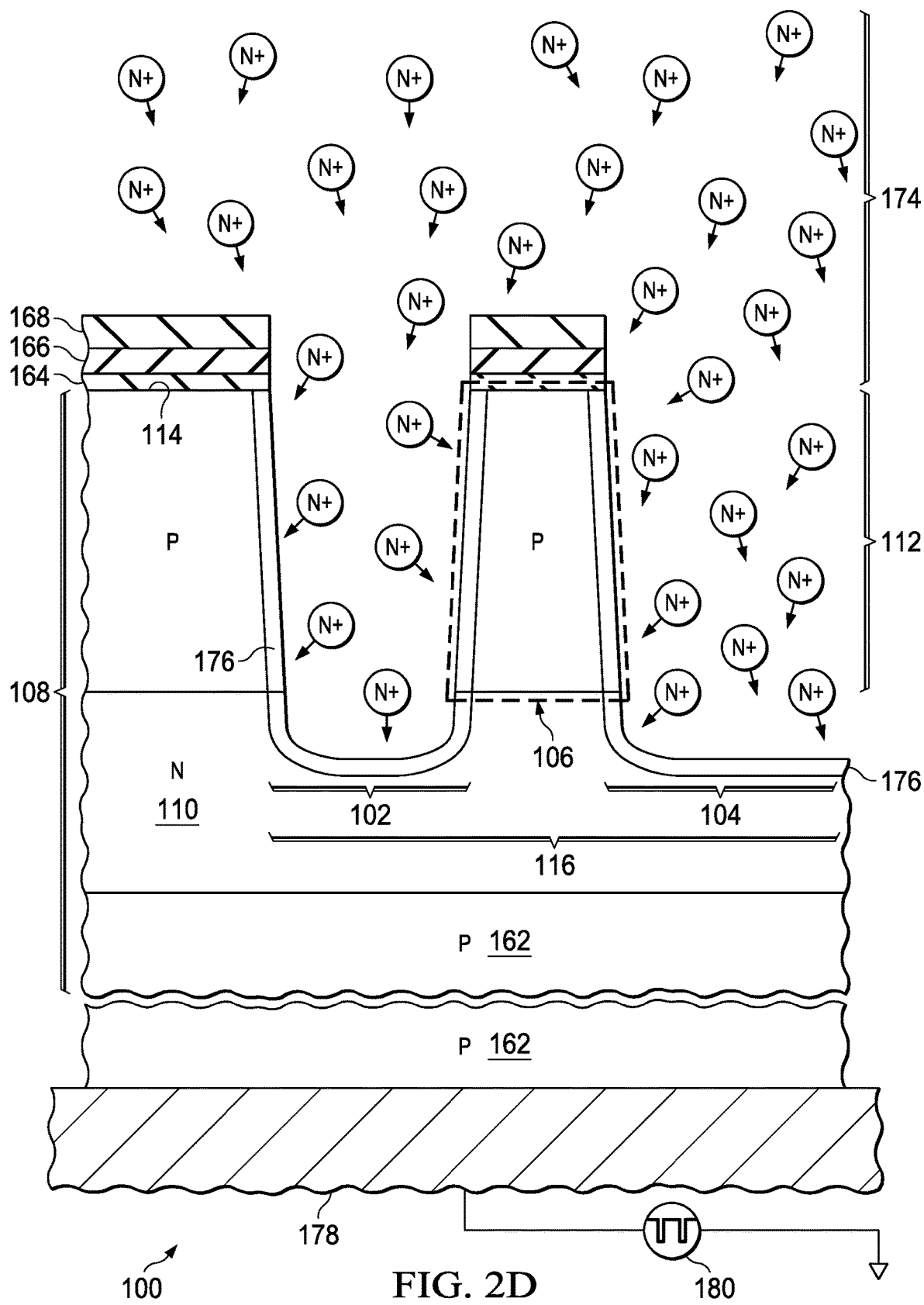
Figure 2E:
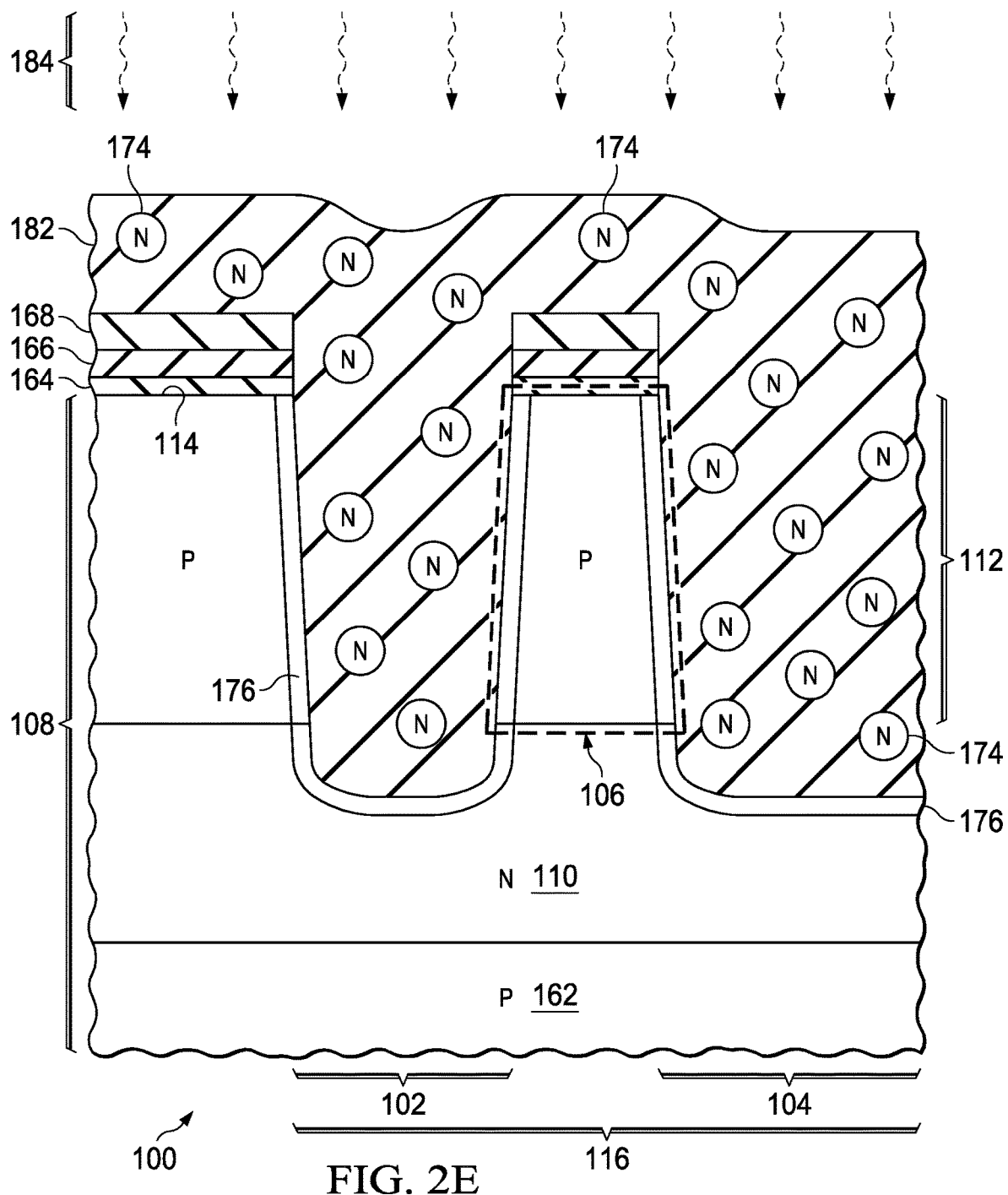

FIG. 2C through FIG. 2E depict three alternative processes for introducing dopants of the first conductivity type, n-type dopants in this example, into the semiconductor layer 112 at sidewalls of the first trench 102 and the second trench 104. Referring to FIG. 2C, n-type dopants 174 may be implanted into the semiconductor layer 112 by an ion implant process at the sidewalls of the first trench 102 and the second trench 104 to form a doped layer 176 in the semiconductor layer 112 along the sidewalls of the first trench 102 and the second trench 104. The n-type dopants 174 may include phosphorus, to provide a desired diffusion of the n-type dopants 174 during a subsequent anneal process. The ion implant process may be an angled ion implant process in which the n-type dopants 174 may be implanted at one or more angles with respect the top surface 114, such as 15 degrees to 30 degrees from perpendicular to the top surface 114. The angled implant process may implant the n-type dopants 174 in 4 steps at 90 degree increments of twist angle to provide a more uniform distribution of the n-type dopants 174 in the doped layer 176. Implanting the n-type dopants 174 at an angle may advantageously increase a depth into the semiconductor layer 112 at which the n-type dopants 174 are implanted. The n-type dopants 174 are blocked from the semiconductor layer 112 at the top surface 114 away from the first trench 102 and the second trench 104 by the hard mask layer 168 and the silicon nitride cap layer 166. The n-type dopants 174 may be implanted at a dose of $1 \times 10^{12}$ cm$^{-2}$ to $5 \times 10^{15}$ cm$^{-2}$, by way of example. The doped layer 176 may extend below bottoms of the first trench 102 and the second trench 104 into the isolation layer 110, as depicted in FIG. 2C. Alternatively, the doped layer 176 may terminate above the bottoms of the first trench 102 and the second trench 104, particularly in cases of the first trench 102 and the second trench 104 with high aspect ratios, that is, depth-to-width ratios above 5. Forming the doped layer 176 using the ion implant process may advantageously provide a desired dose amount of the n-type dopants 174 with lower fabrication cost and complexity compared to other methods, especially for fabrication facilities lacking other means for forming the doped layer 176.

Referring to FIG. 2D, the n-type dopants 174 may be introduced into the semiconductor layer 112 by a plasma immersion ion implantation process at the sidewalls of the first trench 102 and the second trench 104 to form the doped layer 176 in the semiconductor layer 112 along the sidewalls and bottoms of the first trench 102 and the second trench 104. The plasma immersion ion implantation process produces the n-type dopants 174 in the form of positive ions, by forming a plasma using a dopant reagent gas, such as phosphene. A negative bias potential is applied to the substrate 108 with respect to the n-type dopants 174, causing the n-type dopants 174 to accelerated toward the substrate 108 and implanted into the semiconductor layer 112 along the sidewalls and bottoms of the first trench 102 and the second trench 104. The negative bias potential may be applied to the substrate 108 by placing the substrate 108 on a wafer chuck 178 and applying the negative bias potential using a voltage source 180. The ion implantation process may be implemented as a pulsed plasma ion implantation process in which the voltage source 180 is implemented as a pulsed voltage source 180, which provides negative bias pulses, to implant the n-type dopants 174 more uniformly along the sidewalls and bottoms of the first trench 102 and the second trench 104. Between the negative bias pulses, the n-type dopants 174 may diffuse into the first trench 102 and the second trench 104 from the plasma to replace the n-type dopants 174 which were implanted by the previous negative bias pulse. Forming the doped layer 176 using the plasma immersion ion implantation process may advantageously provide a more uniform distribution of the n-type dopants 174 in the doped layer 176 than other methods, especially for cases of the first trench 102 and the second trench 104 with high aspect ratios.

Referring to FIG. 2E, the n-type dopants 174 may be introduced into the semiconductor layer 112 by forming a doped oxide layer 182 that includes the n-type dopants 174 over the substrate 108 and extending into the first trench 102 and the second trench 104, contacting the semiconductor layer 112. The doped oxide layer 182 may include silicon dioxide or a silicon dioxide-base material, such as a partially hydrogenated silicon dioxide material. The doped oxide layer 182 may be formed by a spin-on process using methyl silsesquioxane (MSQ) or hydrogen silsesquioxane (HSQ), with phosphorus. Alternatively, the doped oxide layer 182 may be formed by a CVD or PECVD process using dichlorosilane, oxygen, or tetraethoxy silane (TEOS), also referred to as tetraethyl orthosilicate, and phosphene to provide the n-type dopants 174. The n-type dopants 174 may be present in the doped oxide layer 182 at an average concentration above $10^{20}$ cm$^{-3}$.

Following formation of the doped oxide layer 182, the substrate 108 is heated by a heating process 184 to a temperature of 800° C. to 1000° C. for 10 seconds to 100 seconds, causing a portion of the n-type dopants 174 to diffuse from the doped oxide layer 182 into the semiconductor layer 112 along the sidewalls and bottoms of the first trench 102 and the second trench 104, to form the doped layer 176. The heating process 184 may be implemented using a rapid thermal processor (RTP) tool, by way of example. Increasing the temperature of the substrate 108 and increasing the time the substrate 108 is heated may increase the portion of the n-type dopants 174 that is transferred from the doped oxide layer 182 into the doped layer 176. The doped oxide layer 182 may be removed, prior to performing additional fabrication steps. The doped oxide layer 182 may be removed using a dilute buffered aqueous solution of hydrofluoric acid, for example.

Figure 2F:
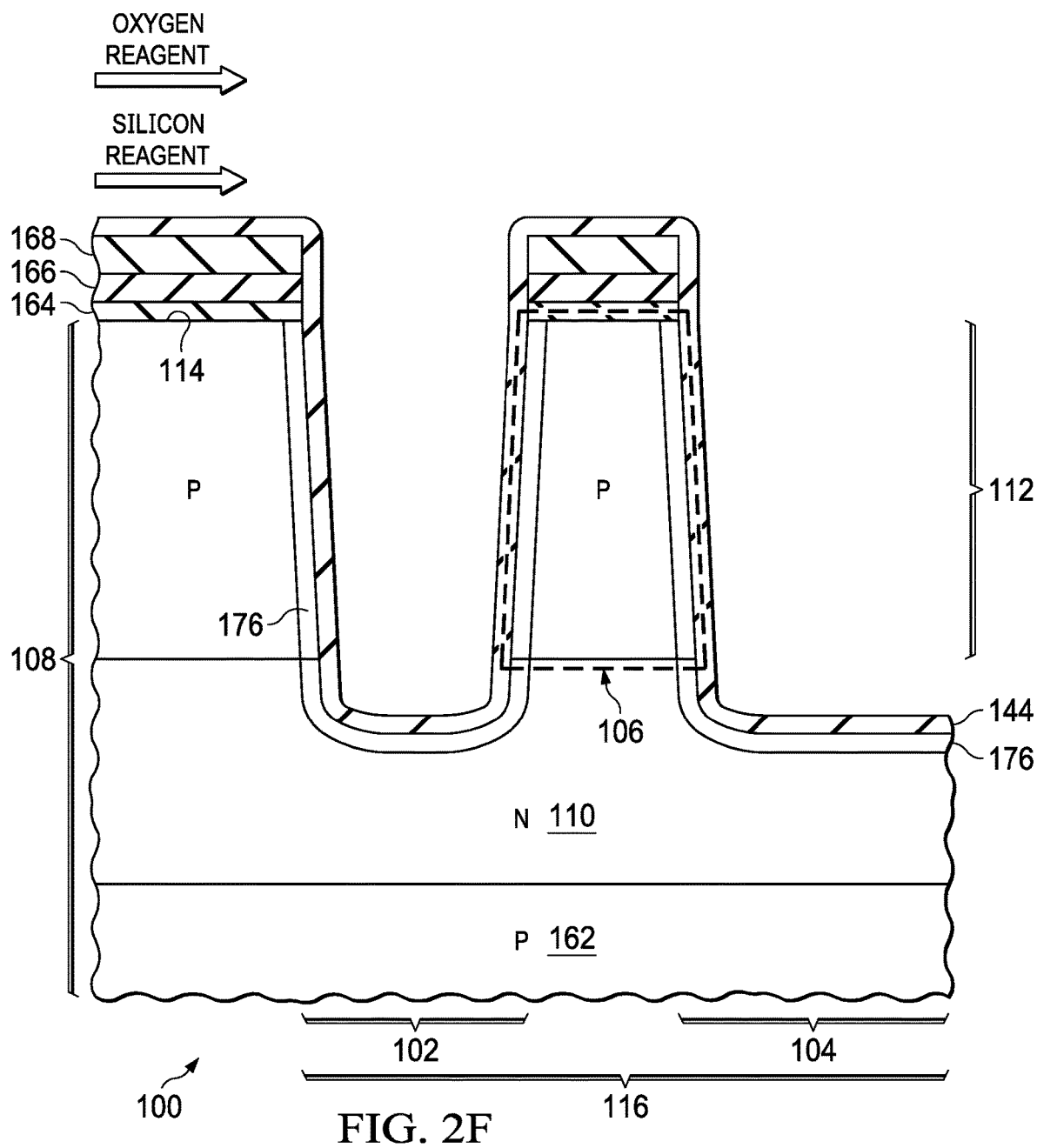

Referring to FIG. 2F, the trench liner 144 may be deposited onto the surfaces of the substrate 108. The trench liner 144 may be formed by a CVD or PECVD process using a silicon-containing reagent, such as silane, TEOS, or dichlorosilane, labeled "SILICON REAGENT" in FIG. 2F, and an oxygen-containing reagent, such as oxygen, TEOS, nitrous oxide, or ozone, labeled "OXYGEN REAGENT" in FIG. 2F. In one implementation, the CVD process may include a sub atmospheric chemical vapor deposition (SACVD) process. Formation of the trench liner 144 may be followed by a trench dielectric etch process to achieve a uniform thickness of the trench liner 144 along the sidewalls of the first trench 102 and the second trench 104. In an alternate version of this example, the trench liner 144 may include silicon dioxide formed by a thermal oxidation process. The trench liner 144 may have a thickness of 20 nanometers to 200 nanometers, by way of example. In a further version of this example, the trench liner 144 may be omitted.

Figure 2G:
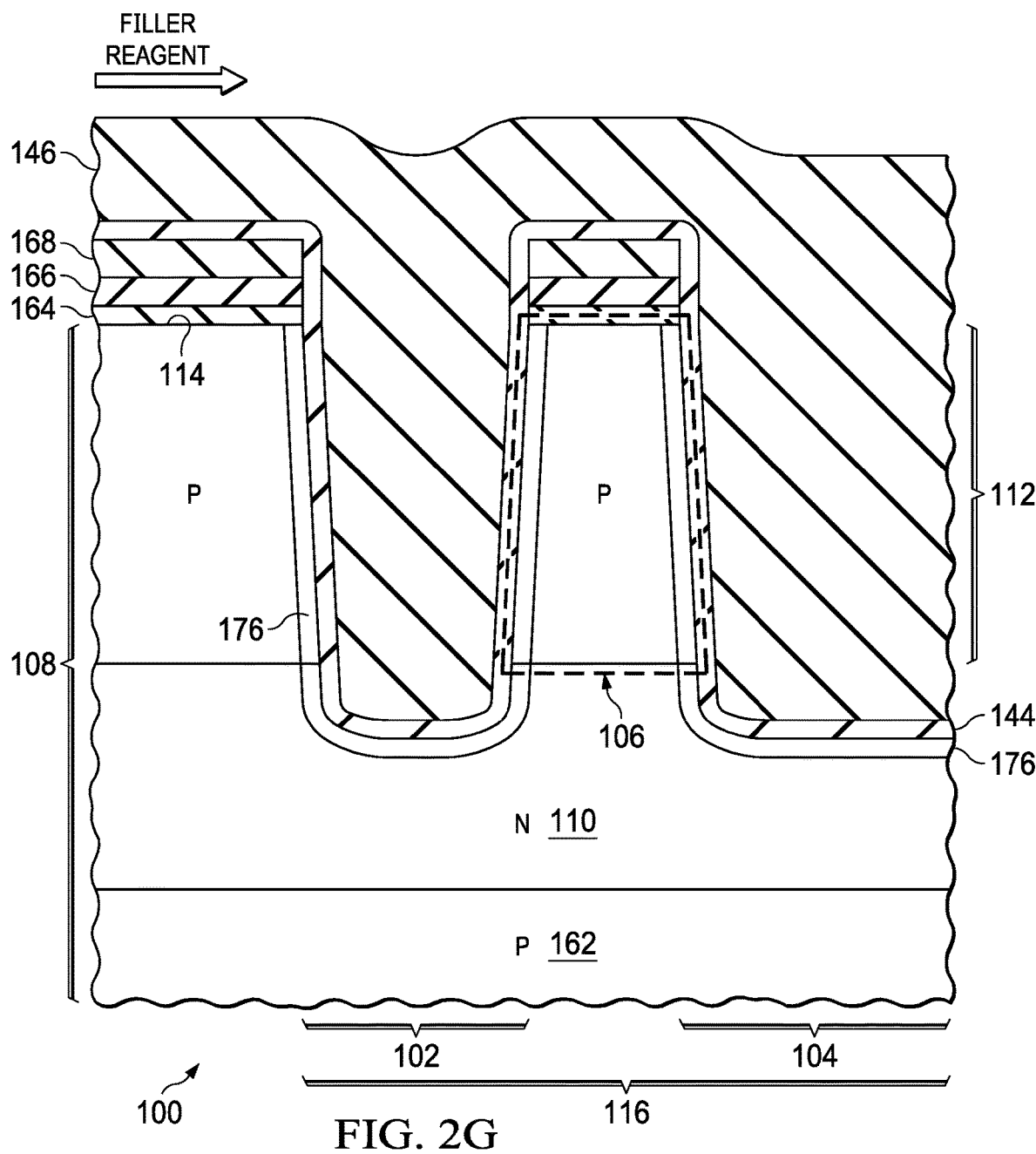

Referring to FIG. 2G, a trench filler material 146 is formed in the first trench 102 and the second trench 104. In versions of the example in which the trench liner 144 is formed, the trench filler material 146 may contact the trench liner 144, as depicted in FIG. 2G. In versions of this example in which the trench liner 144 is omitted, the trench filler material 146 may directly contact the semiconductor layer 112 at the sidewalls of the first trench 102 and the second trench 104. The trench filler material 146 may be formed by a CVD or PECVD process using a filler reagent gas, labeled "FILLER REAGENT" in FIG. 2G. In versions of the example in which the trench liner 144 is formed, the trench filler material 146 may include electrically conductive material such as polysilicon. Polysilicon in the trench filler material 146 may be formed by a CVD process in which the filler reagent gas is implemented as silane or disilane. In versions of this example in which the trench liner 144 is omitted, the trench filler material 146 may include silicon dioxide. Silicon dioxide in the trench filler material 146 may be formed by a CVD process in which the filler reagent gas is implemented as TEOS or a combination of a silicon-containing reagent such as silane or dichlorosilane, and an oxygen-containing reagent, such as oxygen, TEOS, nitrous oxide, or ozone. The trench filler material 146 fills the first trench 102 and the second trench 104, and may extend over the top surface 114 of the substrate 108 adjacent to the first trench 102 and the second trench 104.

Figure 2H:
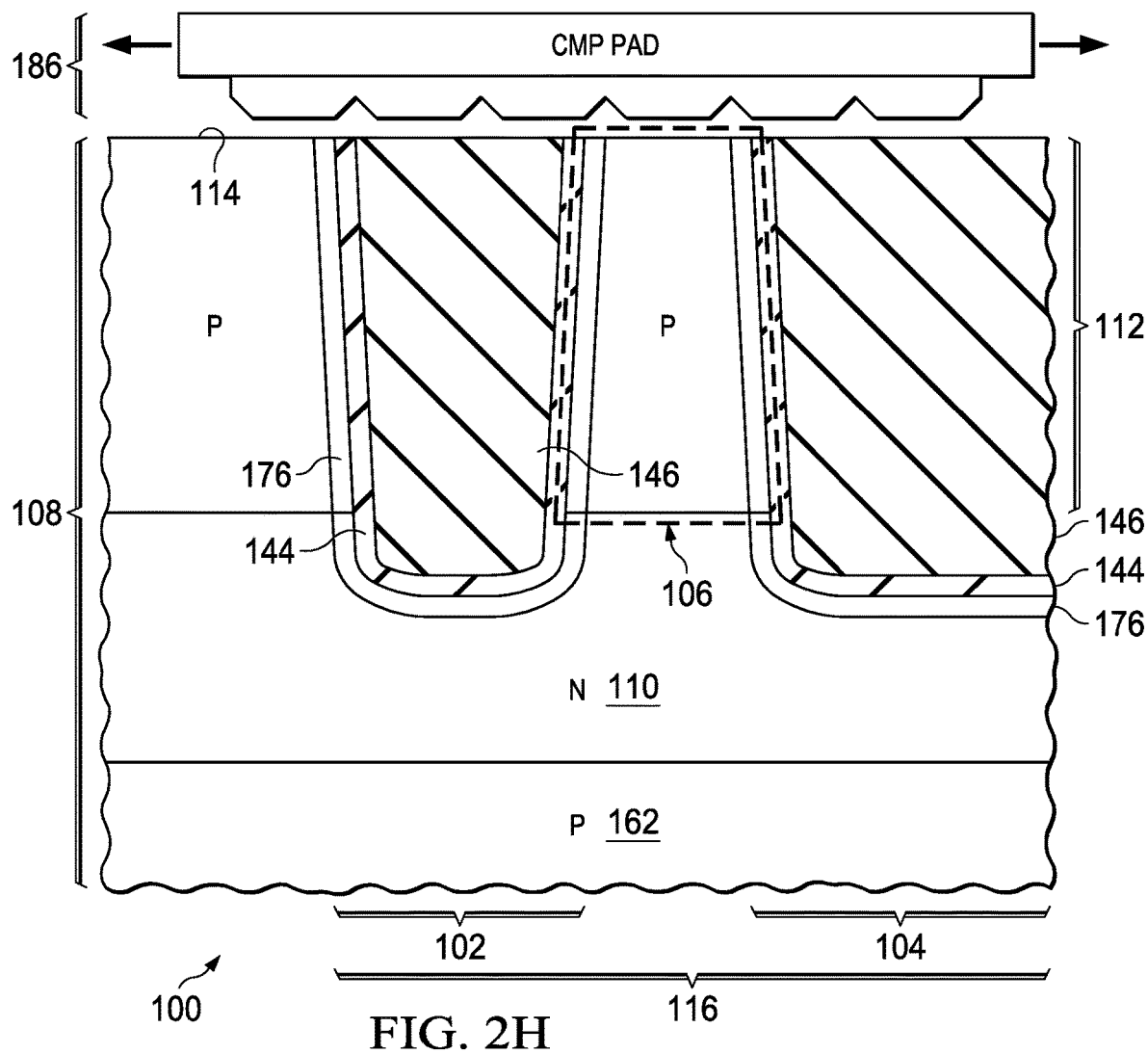

Referring to FIG. 2H, after the trench filler material 146 is formed, material of the trench filler material 146 outside of the first trench 102 and the second trench 104 is removed by a planarization process 186, leaving the trench filler material 146 within the first trench 102 and the second trench 104. The planarization process 186 may be implemented as a chemical mechanical polish (CMP) process, as indicated in FIG. 2H, or an etch back process, by way of example. The planarization process 186 may remove a portion, or all, of the pad oxide layer 164, the silicon nitride cap layer 166, and the hard mask layer 168, of FIG. 2G.

Figure 2I:
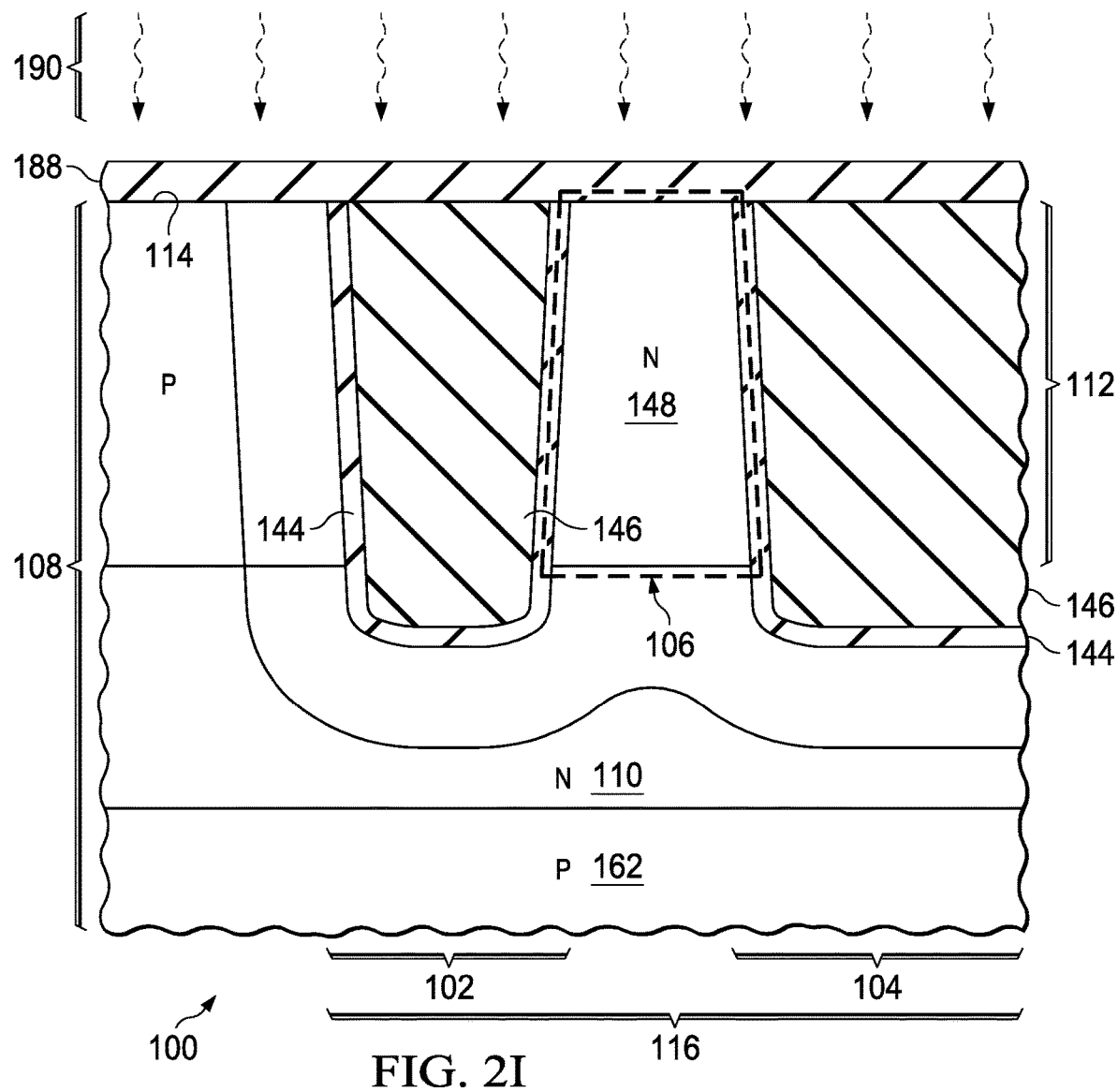

Referring to FIG. 2I, after the planarization process of FIG. 2H is completed, a diffusion cap layer 188 may be formed over the substrate 108. The diffusion cap layer 188 may include one or more sublayers of silicon dioxide and silicon nitride. The diffusion cap layer 188 may be formed by a thermal oxidation process followed by an LPCVD process. A thermal anneal process 190 is performed which diffuses and activates the n-type dopants 174 of FIG. 2C through FIG. 2E in the doped layer 176 of FIG. 2H to form the doped sheath 148. The doped sheath 148 extends from the first trench 102 to the second trench 104 and extends from the isolation layer 110 to the top surface 114 of the semiconductor layer 112. The doped sheath 148 fills the first trench space 106. The thermal anneal process 190 may be implemented as a furnace anneal process, at a temperature range of 900° C. to 1100° C., and a time of 1 hour to 20 hours, by way of example. The doped sheath 148 may extend up to 6 microns away from the first trench 102 and the second trench 104. The diffusion cap layer 188 may advantageously reduce loss of the n-type dopants 174 from the substrate 108 during the thermal anneal process 190. The first trench 102, the second trench 104, the trench liner 144 if present, the trench filler material 146, and the doped sheath 148 are parts of the trench structure 116. Forming the trench structure 116 as disclosed in this example may advantageously provide a desired level of electrical isolation between the isolated region 152 and the external region 150 of FIG. 1 at a lower level of stress in the isolated region 152 and the external region 150, as disclosed in reference to FIG. 1.

Figure 3:
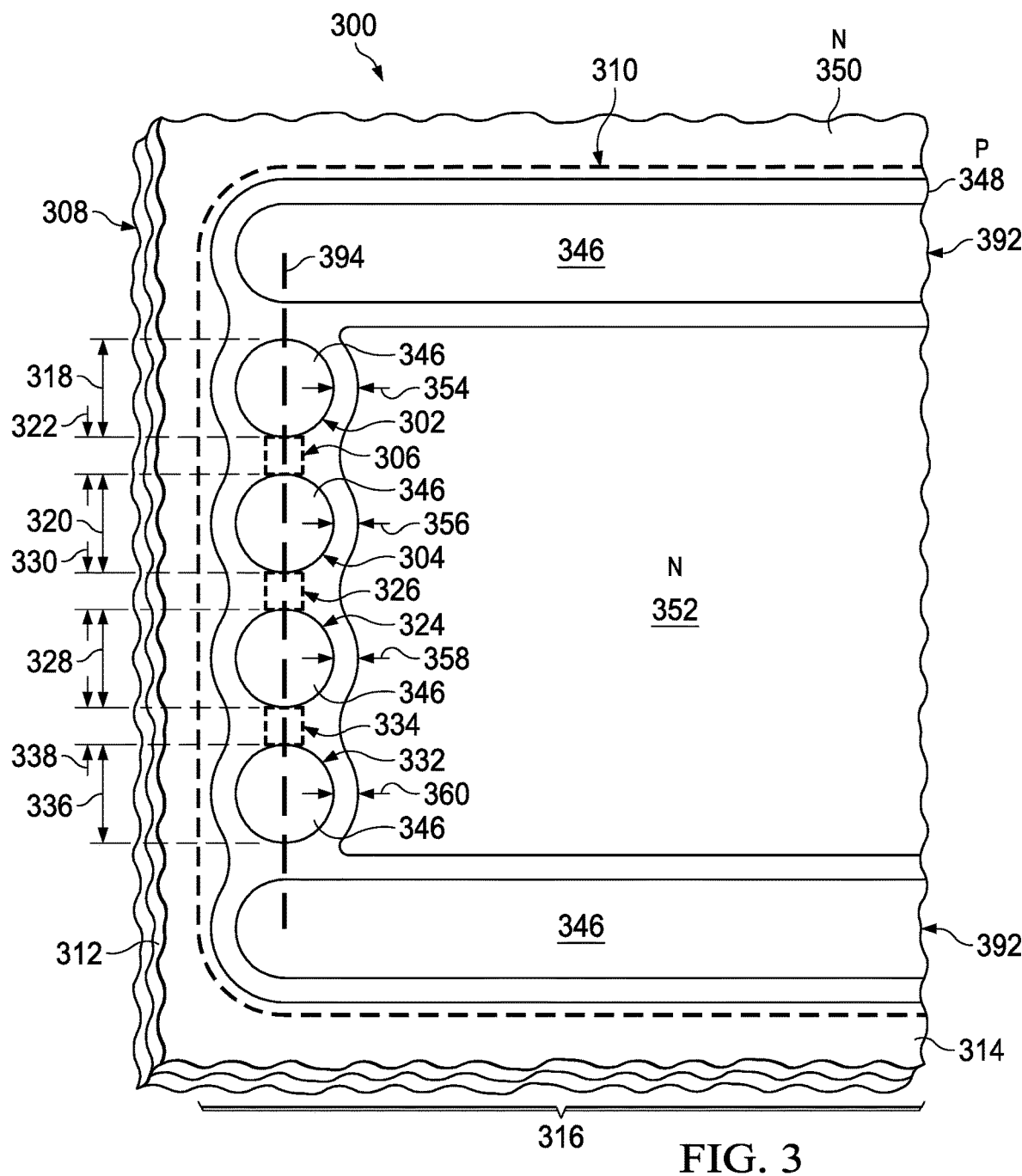
FIG. 3 is a top view of another example semiconductor device having a first trench and a second trench separated by a first trench space.

FIG. 3 is a top view of another example semiconductor device 300 having a first trench 302 and a second trench 304 separated by a first trench space 306. The semiconductor device 300 may be manifested as any of the device types disclosed in reference to FIG. 1. The semiconductor device 300 is formed in and on a substrate 308. The substrate 308 includes an isolation layer 310 and a semiconductor layer 312 on the isolation layer 310. The semiconductor layer 312 has a top surface 314 located opposite from the isolation layer 310. The semiconductor device 300, the substrate 308, and the isolation layer 310 may be manifested according to any of the examples disclosed in reference to FIG. 1. The semiconductor device 300 of this example includes a trench structure 316 which includes the first trench 302, the second trench 304, a third trench 324, and a fourth trench 332. In this example, the trench structure 316 may further include additional trenches 392 located around an isolated region 352 of the semiconductor layer 312. The four trenches 302, 304, 324, and 332, and the additional trenches 392 extend from the top surface 314 of the semiconductor layer 312 to the isolation layer 310.

The trench structure 316 has a trench filler material 346 in the four trenches 302, 304, 324, and 332, and the additional trenches 392. The trench filler material 346 may make direct contact with the semiconductor layer 312 along sidewalls of the four trenches 302, 304, 324, and 332, and the additional trenches 392, as indicated in FIG. 3. The trench filler material 346 may be electrically non-conductive, and may include dielectric material such as silicon dioxide. Alternatively, the trench structure 316 may have a trench liner, not shown in FIG. 3, in the four trenches 302, 304, 324, and 332, and the additional trenches 392, directly contacting the semiconductor layer 312 along sidewalls, and the trench filler material 346 may contact the trench liner, similar to the structure of FIG. 1.

The trench structure 316 includes a doped sheath 348 which contacts and laterally surrounds the first trench 302, the second trench 304, the third trench 324, the fourth trench 332, and the additional trenches 392. The doped sheath 348 extends from the top surface 314 of the semiconductor layer 312 to the isolation layer 310. The doped sheath 348 has a first conductivity type, which may be p-type, as indicated in FIG. 3. The isolation layer 310 extends under the isolated region 352 and under the doped sheath 348. A combination of the four trenches 302, 304, 324, and 332, the additional trenches 392, and the doped sheath 348 laterally isolates the isolated region 352 from an external region 350 located outside of the doped region 348. The isolated region 352 and the external region 350 have a second conductivity type, opposite from the first conductivity type; in this example, the isolated region 352 and the external region 350 may be n-type, as indicated in FIG. 3. The isolated region 352 and the external region 350 contact the doped region 348.

The first trench 302 has a first trench width 318 which is a minimum lateral dimension of the first trench 302 measured at the top surface 314. Similarly, the second trench 304, the third trench 324, the fourth trench 332 have a second trench width 320, a third trench width 328, and a fourth trench width 336, respectively, which are minimum lateral dimension of the second trench 304, the third trench 324, the fourth trench 332, measured at the top surface 314. In this example, the four trenches 302, 304, 324, and 332 may have trench lengths, which are maximum lateral dimensions measured at the top surface 314, that are substantially equal to the trench widths 318, 320, 328, and 336. In alternative versions of this example, the trench lengths may be greater than the trench widths 318, 320, 328, and 336.

The second trench 304 is separated from the first trench 302 by the first trench space 306, which has a first space width 322 that is less than the first trench width 318 and less than the second trench width 320. The third trench 324 is separated from the second trench 304 by a second trench space 326, which has a second space width 330 that is less than the second trench width 320 and less than the third trench width 328. The fourth trench 332 is separated from the third trench 324 by a third trench space 334, which has a third space width 338 that is less than the third trench width 328 and less than the fourth trench width 336. In the first trench space 306, the doped sheath 348 extends from the top surface 314 of the semiconductor layer 312 to the isolation layer 310 and from the first trench 302 to the second trench 304. In the second trench space 326, the doped sheath 348 extends from the top surface 314 of the semiconductor layer 312 to the isolation layer 310 and from the second trench 304 to the third trench 324. In the third trench space 334, the doped sheath 348 extends from the top surface 314 of the semiconductor layer 312 to the isolation layer 310 and from the third trench 324 to the fourth trench 332.

In this example, the first trench 302, the second trench 304, the third trench 324, and the fourth trench 332 may be configured in a straight line, so that the first trench space 306, the second trench space 326, and the third trench space 334 intersect a same plane 394 that is perpendicular to the top surface 314 of the semiconductor layer 312. The linear configuration of the four trenches 302, 304, 324, and 332, with the doped sheath 348, may advantageously provide isolation between the isolated region 352 and the external region 350 with lower stress in the isolated region 352 than other trench configurations. In versions of this example in which the isolation layer 310 is manifested as a semiconductor layer having the first conductivity type, the linear configuration of the four trenches 302, 304, 324, and 332, with the doped sheath 348 contacting the isolation layer 310 in the first trench space 306, the second trench space 326, and the third trench space 334 as well as along the sides of the four trenches 302, 304, 324, and 332, may advantageously provide a lower resistance connection between the top surface 314 and the isolation layer 310 compared to a continuous trench. In an alternative version of this example, the additional trenches 392 may have similar dimensions to the four trenches 302, 304, 324, and 332, and may have linear configurations, so that the isolated region 352 is surrounded on all sides by trenches with dimensions similar to the four trenches 302, 304, 324, and 332, thereby further accruing the advantages of lower stress and lower resistance connection between the top surface 314 and the isolation layer 310.

Figure 4:
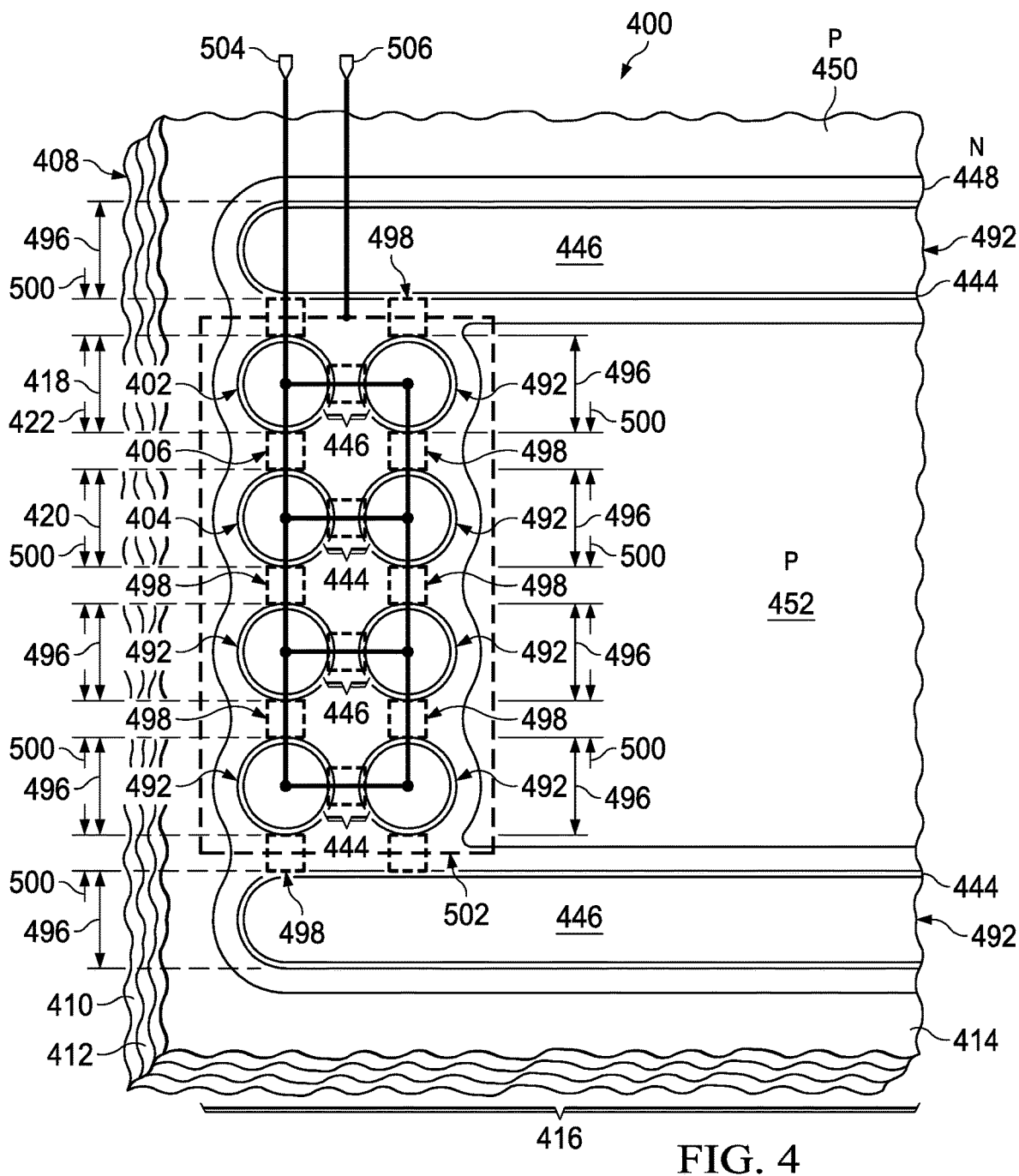
FIG. 4 is a top view of a further example semiconductor device having a first trench and a second trench separated by a first trench space.

FIG. 4 is a top view of a further example semiconductor device 400 having a first trench 402 and a second trench 404 separated by a first trench space 406. The semiconductor device 400 may be manifested as any of the device types disclosed in reference to FIG. 1. The semiconductor device 400 is formed in and on a substrate 408. The substrate 408 includes an isolation layer 410 and a semiconductor layer 412 on the isolation layer 410. The isolation layer 410 may extend across the semiconductor device 400, as indicated in FIG. 4, or may be localized, as depicted in FIG. 1 and FIG. 3. The semiconductor layer 412 has a top surface 414 located opposite from the isolation layer 410. The semiconductor device 400, the substrate 408, and the isolation layer 410 may be manifested according to any of the examples disclosed in reference to FIG. 1. The semiconductor device 400 of this example includes a trench structure 416 which includes the first trench 402, the second trench 404, and additional trenches 492 located around an isolated region 452 of the semiconductor layer 412. The trenches 402 and 404, and the additional trenches 492 extend from the top surface 414 of the semiconductor layer 412 to the isolation layer 410.

The trench structure 416 includes a trench liner 444 in the trenches 402 and 404, and the additional trenches 492, directly contacting the semiconductor layer 412 along sidewalls of the trenches 402 and 404, and the additional trenches 492. The trench liner 444 of this example is electrically non-conductive, and may include one or more sublayers of dielectric material. In one version of this example, the trench liner 444 may include a first sublayer of silicon dioxide contacting the semiconductor layer 412, a second sublayer of silicon nitride on the first sublayer, and a third sublayer of silicon dioxide or silicon oxynitride on the second sublayer. The trench structure 416 further includes a trench filler material 446 in the trenches 402 and 404, and the additional trenches 492, on the trench liner 444. The trench filler material 446 of this example is electrically conductive, and may polysilicon, by way of example.

The trench structure 416 includes a doped sheath 448 which contacts and laterally surrounds the trenches 402 and 404, and the additional trenches 492. The doped sheath 448 extends from the top surface 414 of the semiconductor layer 412 to the isolation layer 410. The doped sheath 448 has a first conductivity type, which may be n-type, as indicated in FIG. 4. A combination of the trenches 402 and 404, and the additional trenches 492, and the doped sheath 448 laterally isolates the isolated region 452 from an external region 450 located outside of the doped region 448. The isolated region 452 and the external region 450 have a second conductivity type, opposite from the first conductivity type; in this example, the isolated region 452 and the external region 450 may be n-type, as indicated in FIG. 4. The isolated region 452 and the external region 450 contact the doped region 448.

The first trench 402 has a first trench width 418, the second trench 404 has a second trench width 420, and each of the additional trenches 492 has a separate trench width 496, which are minimum lateral dimensions of the respective trenches 402, 404, and 492, measured at the top surface 414. The second trench 404 is separated from the first trench 402 by the first trench space 406, which has a first space width 422 that is less than the first trench width 418 and less than the second trench width 420. Each of the trenches 402, 404, and 492 is separated from an immediately adjacent trench 402, 404, or 492 by the first trench space 406 or a trench space 498 which has the first space width 422 or a space width 500 that is less than the trench width 418, 420, or 496 of the trench 402, 404, or 492, and the immediately adjacent trench 402, 404, or 492. In each trench space 406 and 498, the doped sheath 448 extends from the top surface 414 of the semiconductor layer 412 to the isolation layer 410 and from the trench 402, 404, or 492, to the immediately adjacent trench 402, 404, or 492.

In this example, the first trench 402, the second trench 404, and a portion, or all, of the additional trenches 492 may provide a capacitor 502. The trench filler material 446 may provide a first plate 504 of the capacitor 502, and the doped sheath 448 may provide a second plate 506 of the capacitor 502. The trench liner 444 may provide a capacitor dielectric of the capacitor 502. Having the capacitor 502 in the trench structure 416 which isolates the isolated region 452 from the external region 450 may advantageously reduce an area of the semiconductor device 400 compared to a similar device with a separate isolation structure and capacitor. In versions of this example in which the isolation layer 410 is manifested as a semiconductor layer having the first conductivity type, the configuration of the trenches 402, 404, and 492, with the doped sheath 448 contacting the isolation layer 410 in the first trench space 406 and the additional trench spaces 498, as well as along the sides of the trenches 402, 404, and 492, may advantageously provide a lower resistance connection between the top surface 414 and the isolation layer 410 compared to a continuous trench.

Various features of the examples disclosed herein may be combined in other manifestations of example semiconductor devices. For example, any of the isolation layers 110, 310, or 410 may include semiconductor material or may include electrically non-conductive material. Either of the trench structures 116 or 316 may include a trench liner of dielectric material such as the trench liner 144 or 344, or may have the trench filler material 146 or 346 directly on the semiconductor layer 112 or 312. In any of the examples disclosed, the first conductivity type may be n-type or may be p-type.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
a substrate, the substrate including:
an isolation layer; and
a semiconductor layer over the isolation layer, the semiconductor layer having a top surface located opposite from the isolation layer;
a trench structure located in the substrate, the trench structure including:
a first trench extending from the top surface to the isolation layer, the first trench having a first trench width at the top surface;
a second trench extending from the top surface to the isolation layer, the second trench having a second trench width at the top surface, the second trench being laterally separated from the first trench by a trench space;
a doped sheath contacting and laterally surrounding the first trench and the second trench, the doped sheath having a first conductivity type, wherein the doped sheath extends from the top surface to the isolation layer and from the first trench to the second trench across the trench space;
a first region in the semiconductor layer over the isolation layer, the first region having a second conductivity type, opposite from the first conductivity type, the first region abutting the doped sheath on a first side of the first trench and a first side of the second trench; and
a second region in the semiconductor layer, the second region having the second conductivity type, the second region abutting the doped sheath on a second side of the first trench and a second side of the second trench, opposite from the first region.

2. The semiconductor device of claim 1, wherein the doped sheath extends outward from the first trench by a first outward distance that is no greater than 6 microns, and extends outward from the second trench by a second outward distance that is no greater than 6 microns.

3. The semiconductor device of claim 1, wherein the trench structure includes:
a corresponding trench liner in each of the first trench and the second trench, each trench liner being electrically non-conductive and contacting the doped sheath; and
a corresponding trench filler material on each trench liner, the trench filler material being electrically conductive.

4. The semiconductor device of claim 1, wherein the trench structure includes a trench filler material in each of the first trench and second trench, the trench filler material being electrically non-conductive, the trench filler material contacting the doped sheath.

5. The semiconductor device of claim 1, wherein:
the trench space is a first trench space;
the trench structure further includes:
a third trench extending from the top surface to the isolation layer, the third trench having a third trench width at the top surface, the third trench being laterally separated from the second trench by a second trench space that is less than the second trench width and less than the third trench width; and
a fourth trench extending from the top surface to the isolation layer, the fourth trench having a fourth trench width at the top surface, the fourth trench being laterally separated from the third trench by a third trench space that is less than the third trench width and less than the fourth trench width, the fourth trench being laterally separated from the first trench by a fourth trench space that is less than the fourth trench width and less than the first trench width;
the doped sheath contacts and laterally surrounds the third trench and the fourth trench;
the doped sheath extends from the top surface to the isolation layer and from the second trench to the third trench across the second trench space;
the doped sheath extends from the top surface to the isolation layer and from the third trench to the fourth trench across the third trench space; and
the doped sheath extends from the top surface to the isolation layer and from the fourth trench to the first trench across the fourth trench space.

6. The semiconductor device of claim 1, wherein:
the trench space is a first trench space;
the trench structure further includes:
a third trench extending from the top surface to the isolation layer, the third trench having a third trench width at the top surface, the third trench being laterally separated from the second trench by a second trench space that is less than the second trench width and less than the third trench width; and
a fourth trench extending from the top surface to the isolation layer, the fourth trench having a fourth trench width at the top surface, the fourth trench being laterally separated from the third trench by a third trench space that is less than the third trench width and less than the fourth trench width;
the doped sheath contacts and laterally surrounds the third trench and the fourth trench;
the doped sheath extends from the top surface to the isolation layer and from the second trench to the third trench across the second trench space;
the doped sheath extends from the top surface to the isolation layer and from the third trench to the fourth trench across the third trench space; and
the first trench space, the second trench space, and the third trench space each intersect a same plane perpendicular to the top surface.

7. The semiconductor device of claim 1, wherein the isolation layer includes a buried layer of semiconductor material having the first conductivity type.

8. The semiconductor device of claim 1, wherein the trench space is less than the first trench width and less than the second trench width.

9. A method of forming a semiconductor device, comprising:
forming a first trench in a substrate having an isolation layer and a semiconductor layer over the isolation layer, the semiconductor layer having a top surface located opposite from the isolation layer, the first trench extending from the top surface to the isolation layer, the first trench having a first trench width at the top surface;
forming a second trench in the substrate, the second trench extending from the top surface to the isolation layer, the second trench having a second trench width at the top surface, the second trench being laterally separated from the first trench by a trench space that is less than the first trench width and less than the second trench width;
forming a doped sheath in the semiconductor layer laterally surrounding the first trench and the second trench, and extending from the top surface to the isolation layer, the doped sheath having a first conductivity type; and wherein a first region in the semiconductor layer is separated from a second region in the semiconductor layer by a combination of the isolation layer and the doped sheath, the first region and the second region having a second conductivity type, opposite from the first conductivity type, the first region abutting the doped sheath on a first side of the first trench and a first side of the second trench, and the second region abutting the doped sheath on a second side of the first trench and a second side of the second trench, opposite from the first region.

10. The method of claim 9, wherein the trench space between the first trench and the second trench is between 0.1 microns and 10 microns at the top surface.

11. The method of claim 9, wherein forming the doped sheath includes implanting dopants of the first conductivity type into the semiconductor layer along sides of the first trench and the second trench by an angled ion implant process.

12. The method of claim 9, wherein forming the doped sheath includes implanting dopants of the first conductivity type into the semiconductor layer along sides of the first trench and the second trench by a pulsed plasma ion implant process.

13. The method of claim 9, wherein forming the doped sheath includes diffusing dopants of the first conductivity type into the semiconductor layer along sides of the first trench and the second trench from a doped oxide layer in the first trench and the second trench.

14. The method of claim 9, wherein forming the doped sheath includes introducing dopants of the first conductivity type into the semiconductor layer along sides of the first trench and the second trench, and heating the substrate to diffuse the dopants.

15. The method of claim 9, wherein the doped sheath extends outward from the first trench by a first outward distance that is no greater than 6 microns, and extends outward from the second trench by a second outward distance that is no greater than 6 microns.

16. The method of claim 9, further comprising:
forming a trench liner in the first trench and in the second trench, the trench liner being electrically non-conductive, the trench liner contacting the doped sheath;
forming a trench filler material on the trench liner in the first trench and in the second trench, the trench filler material being electrically conductive.

17. The method of claim 9, further comprising forming a trench filler material in the first trench and in the second trench, the trench filler material being electrically non-conductive, the trench filler material contacting the doped sheath.

18. The method of claim 9, wherein the isolation layer includes a buried layer of semiconductor material having the first conductivity type.

* * * * *